US009576909B2

(12) United States Patent
Teh et al.

(10) Patent No.: US 9,576,909 B2
(45) Date of Patent: Feb. 21, 2017

(54) BUMPLESS DIE-PACKAGE INTERFACE FOR BUMPLESS BUILD-UP LAYER (BBUL)

(71) Applicant: INTEL CORPORATION, Santa Clara, CA (US)

(72) Inventors: Weng Hong Teh, Cambridge, MA (US); John S. Guzek, Chandler, AZ (US); Robert L. Sankman, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 255 days.

(21) Appl. No.: 14/367,711

(22) PCT Filed: Aug. 21, 2013

(86) PCT No.: PCT/US2013/056058
§ 371 (c)(1),
(2) Date: Jun. 20, 2014

(87) PCT Pub. No.: WO2015/026344
PCT Pub. Date: Feb. 26, 2015

(65) Prior Publication Data
US 2016/0233166 A1 Aug. 11, 2016

(51) Int. Cl.
*H01L 21/00* (2006.01)
*H01L 29/40* (2006.01)
(Continued)

(52) U.S. Cl.
CPC ......... *H01L 23/5389* (2013.01); *H01L 21/563* (2013.01); *H01L 23/5386* (2013.01);
(Continued)

(58) Field of Classification Search
CPC ..................... H01L 21/563; H01L 23/5389
(Continued)

(56) References Cited

U.S. PATENT DOCUMENTS

| 5,432,677 | A | * | 7/1995 | Mowatt | ............... | H01L 23/5383 |
| | | | | | | 174/252 |
| 6,274,391 | B1 | | 8/2001 | Wachtler et al. | | |

(Continued)

FOREIGN PATENT DOCUMENTS

| JP | 2005191234 | 7/2005 |
| WO | WO2012011933 A1 | 1/2012 |

OTHER PUBLICATIONS

International Search Report and Written Opinion, issued in PCT application No. PCT/US2013/056058, mailed May 28, 2014, 11 pages.
(Continued)

*Primary Examiner* — Calvin Lee
(74) *Attorney, Agent, or Firm* — Schwabe, Williamson & Wyatt, P.C.

(57) ABSTRACT

Embodiments of the present disclosure are directed towards bumpless interfaces to an embedded silicon die, in integrated circuit (IC) package assemblies. In one embodiment, a method includes forming a surrounding portion of dielectric material defining a cavity therein; placing at least one die in the cavity, the die including a contact; depositing a dielectric material on the die and the surrounding portion; etching the dielectric material to expose the contact; and depositing conductive material onto the contact. Other embodiments may be described and/or claimed.

24 Claims, 6 Drawing Sheets

(51) Int. Cl.
*H01L 23/538* (2006.01)
*H01L 23/00* (2006.01)
*H01L 21/56* (2006.01)
*H01L 23/498* (2006.01)
*H01L 25/10* (2006.01)

(52) U.S. Cl.
CPC ........ *H01L 24/19* (2013.01); *H01L 23/49816* (2013.01); *H01L 25/105* (2013.01); *H01L 2224/04105* (2013.01); *H01L 2224/12105* (2013.01); *H01L 2225/1035* (2013.01); *H01L 2225/1058* (2013.01); *H01L 2924/10253* (2013.01); *H01L 2924/1433* (2013.01); *H01L 2924/18162* (2013.01)

(58) Field of Classification Search
USPC .......................... 438/107–110; 257/773–778
See application file for complete search history.

(56) References Cited

U.S. PATENT DOCUMENTS

| | | | | |
|---|---|---|---|---|
| 6,865,089 B2* | 3/2005 | Ho | ...................... | H01L 23/5389 361/761 |
| 6,952,049 B1* | 10/2005 | Ogawa | ................... | H01G 4/232 257/678 |
| 7,307,852 B2* | 12/2007 | Inagaki | ................... | H01G 4/224 361/760 |
| 7,435,910 B2* | 10/2008 | Sakamoto | ........... | H01L 21/4846 174/260 |
| 7,640,655 B2* | 1/2010 | Sunohara | ............ | H01L 23/5385 174/258 |
| 7,727,802 B2* | 6/2010 | Sunohara | ............ | H01L 21/4857 29/832 |
| 7,944,039 B2* | 5/2011 | Arai | ...................... | H01L 21/568 257/690 |
| 8,035,979 B2* | 10/2011 | Yoshino | .............. | H01L 23/5389 361/761 |
| 9,224,674 B2* | 12/2015 | Malatkar | ................ | H01L 23/481 257/531 |
| 2002/0070443 A1* | 6/2002 | Mu | ....................... | H01L 21/561 257/712 |
| 2011/0221055 A1 | 9/2011 | Lin et al. | | |
| 2012/0273941 A1 | 11/2012 | Zeng et al. | | |
| 2013/0171774 A1 | 7/2013 | Chen et al. | | |
| 2013/0270715 A1 | 10/2013 | Malatkar et al. | | |
| 2014/0093999 A1 | 4/2014 | Teh et al. | | |

OTHER PUBLICATIONS

Office Action mailed Dec. 20, 2016 for Korean Patent Application No. 2016-7001693, 15 pages.

* cited by examiner

BUMPLESS DIE-PACKAGE INTERFACE FOR BUMPLESS BUILD-UP LAYER (BBUL)

CROSS REFERENCE TO RELATED APPLICATIONS

The present application is a national phase entry under 35 U.S.C. §371 of International Application No. PCT/US2013/056058, filed Aug. 21, 2013, entitled "BUMPLESS DIE-PACKAGE INTERFACE FOR BUMPLESS BUILD-UP LAYER (BBUL)," which designates, among the various States, the United States of America. The entire content and disclosure of International Application No. PCT/US2013/056058 is hereby incorporated by reference in its entirety.

FIELD

Embodiments of the present disclosure generally relate to the field of integrated circuits, and more particularly, to bumpless interfaces to an embedded silicon die, in integrated circuit (IC) package assemblies and methods of fabricating packaging assemblies including such interfaces.

BACKGROUND

Emerging package assemblies may include embedded dies, for example, processors and memory chips. In order to access these embedded dies, the packaging assemblies must contain conductive pathways to electrically couple a package-level interconnect (e.g., solder balls) to a die contact Current technologies used to fabricate interfaces between dies and the surrounding packaging may require numerous processing steps each contributing to the cost and manufacturing complexity of the assembly. Reducing the number of required steps may simplify processing and reduce the manufacturing cost of the finished package assembly.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
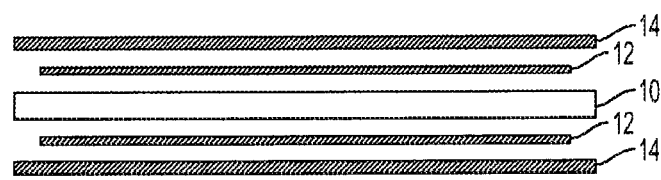
FIGS. 1A-E schematically illustrate cross-section side views of a package substrate during various stages of fabrication, in accordance with some embodiments.

Embodiments of the present disclosure describe bumpless interfaces to an embedded silicon die, in integrated circuit (IC) package assemblies and methods of fabricating packaging assemblies including such interfaces. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "in embodiments," or "in some embodiments," which may each refer to one or more of the same or different embodiments. Furthermore, the terms "comprising." "including," "having," and the like, as used with respect to embodiments of the present disclosure, are synonymous.

The term "coupled with" along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIGS. 1(A)-2(H) illustrate operations for forming an assembly including an embedded die in a cureless substrate, in accordance with certain embodiments. In certain embodiments, two identical embedded die assemblies may be formed in a back to back manner. This is accomplished by mating the assemblies together using an adhesive. For example, as illustrated in FIG. 1(A), a carrier structure includes a material such as a prepreg material 10 on which a metal layer such as a short copper (Cu) foil 12 is positioned on an upper portion thereof. To enable the back-to-back assembly formation, another metal layer such as a short Cu foil 12 is positioned on a lower portion of the prepreg material 10 as illustrated in FIG. 1. Identical assemblies are formed above and below the prepreg material 10, as illustrated in FIGS. 1(A)-2(H). For simplicity, the formation of the assembly above the prepreg material 10 in FIG. 1(A) will be discussed and referenced. A metal layer such as a long Cu toil 14 is coupled to the short Cu foil 12. The long Cu foil 14 may be a sacrificial layer that is removed during later processing. The illustrated assembly may be part of a larger panel of assemblies with a plurality of identical back-to-back structures. In certain embodiments thousands of assemblies may be formed from a single panel. In certain embodiments assemblies may be formed as part of a large panel of back-to-back individual substrate assemblies. The panel may be formed so that the short Cu foil 12 does not extend all the way to the panel edge, while the long Cu foil 14 extends beyond the short Cu foil 12. At those end portions where the short Cu foil 12 is not present, the long Cu foil 14 is bonded to the prepreg material 10 (for example, from epoxy in the prepreg material). This bond between the long Cu foil 14 and the prepreg material 10 acts to hold the assembly together. When panel processing is complete, the end regions where the long Cu foil 14 is bonded to the prepreg material jail 10 are cut. Along the rest of the length of the panel there is nothing holding the long Cu foil to the short Cu foil. The long Cu foil is then etched off the assembly in a later processing operation.

Figure 1B:
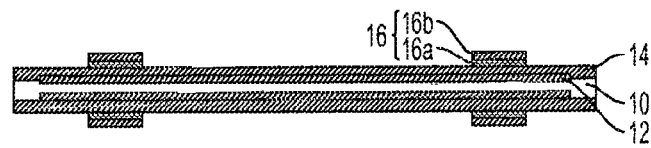

As illustrated in FIG. 1(B), package-on-package (POP) pads 16 are formed on the long Cu foil 14. Any suitable materials for the POP pads 16 may be used, including, but not limited to, a multilayer structure including a first layer 16a comprising gold (Au) and nickel (Ni) and a second layer 16b comprising Cu. The first layer 16a may constitute a surface finish layer that will be on a surface on which another component may be coupled, The POP pads 16 may be formed used any suitable process, including, but not limited to, deposition, masking, and etching operations.

Figure 1C:
Figure 1D:
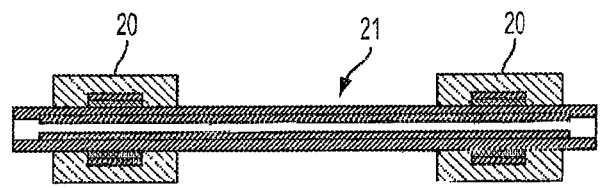

FIG. 1(C) illustrates the formation of a dielectric layer 18 on the long Cu foil 14 and on the POP pads 16. The dielectric layer 18 may be formed from any suitable dielectric material, including, but not limited to, polymeric materials. The dielectric layer 18 may be formed using a BBUL process with a material such as, for example, a polymer. One example of a suitable material is a polymeric epoxy film known as Ajinomoto Build-up Film (ABF), available from Ajinomoto Fine-Techno Company, Inc. As illustrated in FIG. 1(D), the dielectric layer 18 may be patterned to form one or more dielectric regions 20 that cover the POP pads 16 and a cavity or opening 21 is formed between the dielectric regions 20. This may be performed using any suitable process, including, but not limited to, dry film resist (DFR) lithography followed by sandblasting and subsequent DFR removal. The dielectric regions 20 may in certain embodiments be a single dielectric region 20 that extends around part or all of the cavity 21. In other embodiments, the dielectric region 20 may include separate dielectric regions 20 spaced a distance apart from one another.

Figure 1E:
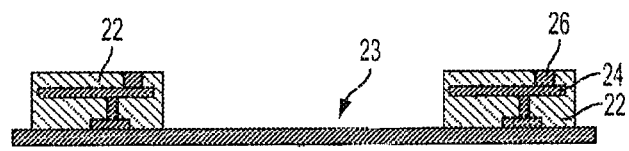

FIG. 1(E) illustrates an alternative arrangement for dielectric regions 22 defining a cavity or opening 23. Starting with FIG. 1(E) only the upper portion of the assembly is shown for clarity. The structures shown in FIG. 1(E) may be formed in two sided processes as discussed above relative to FIGS. 1(A)-1(D). In this embodiment, dielectric regions 22 have a conductive path 26 formed therethrough facilitating an electrical coupling between a top and bottom side of the finished package assembly. While two conductive paths 26 are shown in the cross-section of FIG. 1(E) the dielectric regions 22 may contain any number of discrete or interconnected conductive paths. Dielectric regions 22 may include discrete spaced apart regions or may be a single dielectric region that extends around part or all of the cavity 23. The conductive paths 26 may include one or more redistribution layers 24 allowing for flexible positioning of the intermediate and final contact locations. Dielectric regions 22 and conductive paths 26 may be formed by lamination or other build-up techniques.

Figure 2A:
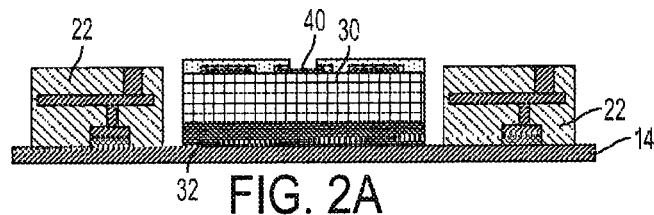
FIGS. 2A-H schematically illustrate cross-section side views of a package substrate during various stages of fabrication, in accordance with some embodiments.
Figure 4:
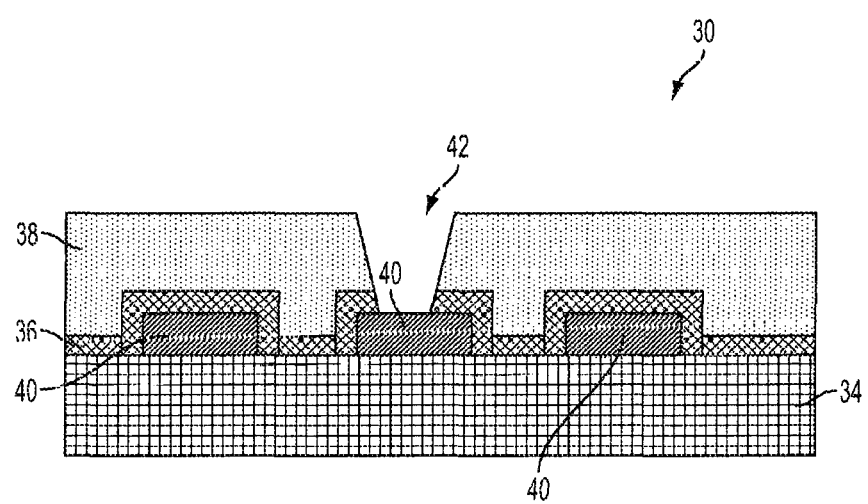
FIG. 4 schematically illustrates a cross-section side view of a die prior to installation, in accordance with some embodiments.

As illustrated in FIG. 2(A), a die 30 may then be mounted in the cavity 23 between the dielectric regions 22 on the long Cu foil 14. A variety of die structures may be utilized, including, but not limited to, silicon die structures with or without through-silicon vias (TSVs). A die bonding film 32 may be positioned between the die 30 and the long Cu foil 14. The die bonding film 32 may be any suitable material, including, but not limited to, a polymer adhesive. The die may include a plurality of die pads 40, as illustrated in FIG. 2(A) and FIG. 4. Though three pads 40 are illustrated, any number may be present. The same process may be used to mount a die 30 in cavity 21 of the arrangement shown in FIG. 1(D). While only one die 30 is shown in FIG. 2(A) in some embodiments it may be possible to place two or more dies in the cavity 23. When two or more dies are used, they may be electrically coupled within the package assembly by depositing conductive material, as discussed below in reference to FIGS. 2(D)-(F), onto adjacent die pads on the dies. In some embodiments, two or more dies may be used but not electrically coupled within the package assembly. In such embodiments each die may be electrically coupled to different package-level contacts (e.g., separate BGA balls in a ball grid array) without being electrically coupled to other dies.

The die 30 may contain one or more recessed exposed contacts as best seen in FIG. 4 (showing one recessed exposed contact formed by opening 42 providing direct access to the top of center die pad 40). The die may be supplied with the recessed exposed contact such that opening 42 is formed and the contact is exposed prior to placing the die in cavity 23 (or cavity 21). As discussed in more detail later with reference to FIG. 4 this arrangement may eliminate processing steps in the fabrication of the die and/or the fabrication of the package assembly thus realizing cost savings and simplifying one or both of the fabrication process and the package assembly.

Figure 2B:
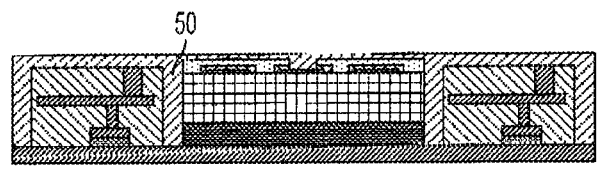

As illustrated in FIG. 2(B) a dielectric material 50 may be deposited on the dielectric regions 22 as well as on the die 30. The dielectric material may fill in any voids that remain in the cavity 23 after the placement of the die 30 in the cavity 23. In addition to filling in any voids in the cavity 23, the dielectric material 50 may be deposited on the dielectric regions 22 as well as on the die 30. The dielectric material 50 may also fill opening 42 defined in the die 30. As such, dielectric material 50 may form a uniform surface to facilitate additional processing steps. The uniform surface may be both planar and contiguous. The uniform surface may be formed by lamination with controlled reflow and planarization. The planarization may be assisted by the dielectric regions 22. The dielectric regions 22 may determine the height and thickness of the dielectric material 50. The dielectric material 50 may be any suitable dielectric materials including those discussed above in reference to FIG. 1(C).

Figure 2C:
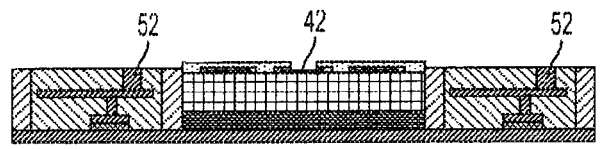

As illustrated in FIG. 2(C) the dielectric material 50 may be etched to expose opening 42 and the top of die pad 40. The dielectric material 50 may also be etched to expose a contact 52 of the conductive path formed through the dielectric regions 22. The etching process may include plasma etching or other suitable etching techniques. The etching process may also be carried out in a manner to control the step height between the die 30 and the dielectric regions 22 to facilitate subsequent processing steps.

Figure 2D:
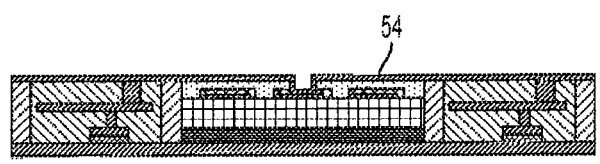

FIG. 2(D) illustrates the next step in the fabrication process in which a conductive material 54 is deposited on the die 30 and the dielectric regions 22. The conductive material 54 may be Copper (Cu), a Titanium-Copper alloy (Ti/Cu), or other suitable conductive materials. The conductive material 54 may be deposited by sputtering or other suitable techniques. The conductive material 54 may be deposited on both the surfaces of the opening 42 as well as the exposed die pad 40 of the die 30. The conductive material 54 may also be deposited on one or more contacts 52 of the conductive path formed through the dielectric regions 22.

Figure 2E:
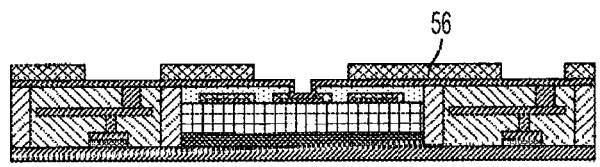

FIG. 2(E) illustrates the package assembly after a patterning process to define regions of patterned material 56 to enable targeted deposition of conductive material as will be discussed below. Regions of patterned material 56 may be formed for instance by applying a dry film resist (DFR) lamination layer and subsequently patterning the layer by photolithography. Alternatively, regions of patterned material 56 may be formed by any other suitable patterning technique. The regions of patterned material 56 are located to leave the opening 42 and the one or more contacts 52 of the conductive path formed through the dielectric regions 22 exposed for the next processing step.

Figure 2F:
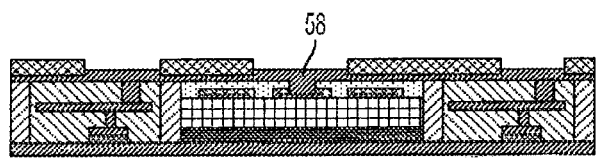

As illustrated in FIG. 2(F) conductive material 58 may be deposited on the exposed areas (those not covered by patterned material 56). The conductive material 58 may be deposited by plating or other suitable techniques. The conductive material 58 may be deposited on and in the opening 42 as well as on the one or more contacts 52 of the conductive path formed through the dielectric regions 22. As such the conductive material 58 may be deposited onto the exposed areas directly as the first layer (L1) as opposed to depositing one or more build-up layers prior to depositing the conductive material 58. This is possible at least in part due to the structure of the die 30 as discussed in more detail regarding FIG. 4 below. Conductive material 58 may be deposited to form lines or other shapes to facilitate additional processing and desired electrical coupling. In some embodiments, depositing the conductive material 58 forms first-level interconnects (FLIs) of the die.

Figure 2G:
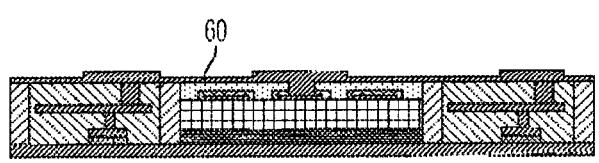

As illustrated in FIG. 2(G) the regions of patterned material 56 may be removed to expose the conductive material 54 that was deposited via sputtering or other techniques as discussed above relative to FIG. 2(D). At this point only regions 60 of conductive material 54 remain exposed because other portions are covered by the additional conductive material 58 deposited via plating or other techniques as discussed above relative to FIG. 2(F). The regions of patterned material 56 may be removed by chemical stripping or other suitable techniques depending upon the specific material used for the patterning process.

Figure 2H:
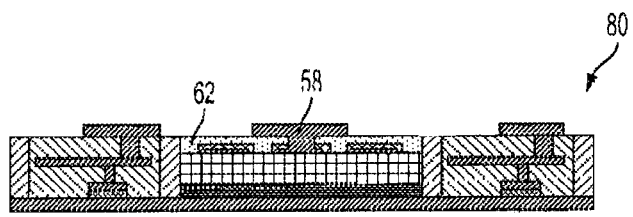

As illustrated in FIG. 2(H) the exposed regions of conductive material 60 (those not covered by additional conductive material 58) may be removed to expose regions of underlying dielectric material 62. The regions of underlying dielectric material 62 may include one or more of the upper portion of the dielectric regions 22, the upper portion of the die 30, and dielectric material located between the die 30 and the dielectric regions 22 discussed relative to FIG. 2(B) above. The regions of underlying dielectric material 62 may define discrete regions of conductive material 58. The exposed regions of conductive material 60 may be removed through flash etching or other suitable techniques. At this point the die is fully incorporated into the package assembly and the conductive material 58 is in place to provide electrical coupling to one or more die pads 40. Additionally, the conductive material 58 is also in place to provide electrical coupling to the one or more conductive paths 26 formed in the dielectric regions 22. The package subassembly 80 shown in FIG. 2(H) is ready for subsequent build-up layers to form the final package assembly.

Figure 3:
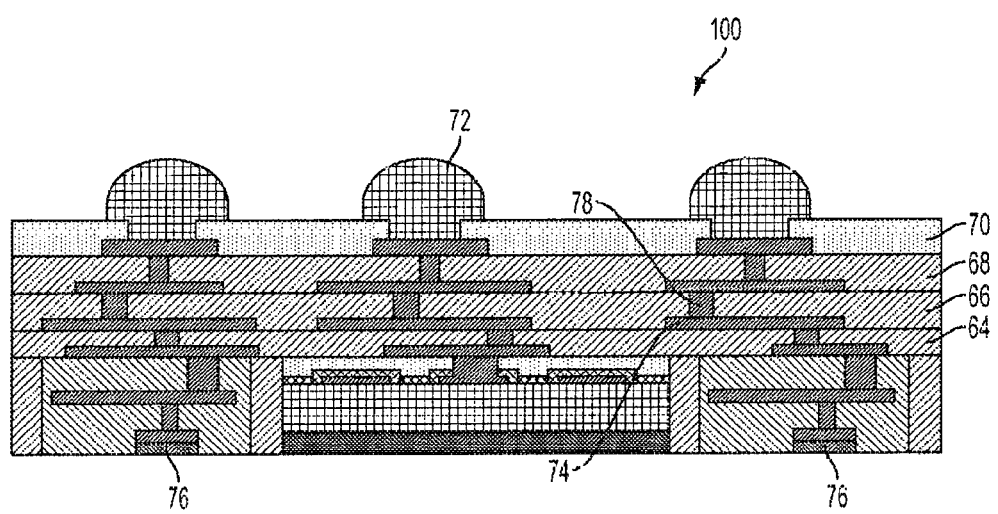
FIG. 3 schematically illustrates a cross-section side view of a package assembly, in accordance with some embodiments.

FIG. 3 illustrates a cross-section side view of an example integrated circuit (IC) package assembly 100 including the package subassembly 80 discussed above relative to FIG. 2(H). Additional bumpless build-up layers (BBUL) may be formed on the package subassembly 80 to meet final packaging requirements and dimensional needs. The additional BBUL layers may include dielectric layers such as 64, 66, 68, conductive redistribution layers such as 74 and conductive vias such as 78 (numerous redistribution layers and vias are shown but not labeled for clarity). While three BBUL layers are shown, any number of BBUL layers may be used. The BBUL layers may be formed by semi-additive processes or other known techniques.

Also illustrated in FIG. 3 is a surface layer 70 disposed on the uppermost BBUL layer. The surface layer 70 may be a material such as a solder resist material having openings patterned therein for package-level interconnects. Package-level interconnects may take the form of a ball grid array (BGA), package-on-package (PoP) pads, or other suitable structures. Package-level interconnects provide electronic coupling between package assembly 100 and circuit boards or other adjacent packages (such as in a pack-on-package (PoP) arrangement). Additionally a ball grid array including one or more discrete BGA balls 72 may be formed to provide electrical connection to other package assemblies. BGA balls 72 may be electrically coupled to die pad 40 through the series of vias and redistribution layers to provide a pathway for communication to and from the die 30. BGA balls 72 also may be formed to provide electrical coupling to the one or more conductive paths 26 formed through the dielectric regions 22. While FIG. 3 illustrates BGA balls 72, it some embodiments, it may be possible to utilize PoP pads or other suitable structures for package-level interconnects.

Further illustrated in FIG. 3 is the depaneling of the original two sided assembly discussed previously to separate the two package assemblies from the prepreg material 10. After the assembly is removed from the prepreg material 10, the long Cu foil 14 may be removed by etching or other suitable techniques to expose the bottom surface of the package assembly 100. The bottom surface of the package assembly may include exposed pads 76 electrically coupled to the one or more conductive paths 26 formed through the dielectric regions 22. The exposed pads 76 allow the package assembly to be electrically coupled to an underlying second package assembly, or a circuit board, by being placed in contact with BGA balls formed on the top of the underlying second package assembly. When used in this manner the conductive paths 26 formed through the dielectric regions 22 may provide electrically coupling between an underlying second package assembly and a third package assembly placed on top of the first package assembly 100 in contact with BGA balls 72. Although not shown in FIG. 3, it is also possible for die 30 to include through silicon vias (TSVs) such that die 30 could be electrically coupled to an underlying second package assembly. It is also possible to connect exposed pads 76 to the die pad 40 by providing conductive material connecting the conductive path 26 formed through a dielectric region 22 to the die pad 40 in the depositing step discussed in reference to FIG. 2(F).

FIG. 4 illustrates a die 30 in accordance with some embodiments. Die 30 may include a semiconductor portion 34. Semiconductor portion 34 may be made from silicon or other semiconductor materials. Semiconductor portion 34 may contain active and/or passive elements and may be designed to perform any function associated with semiconductor assemblies. Semiconductor portion 34 may be formed by known semiconductor fabrication techniques. The die 30 may contain a number of die pads 40 (three shown) to allow the die 30 to be electrically coupled to other components and to facilitate incorporation of the die into a package assembly. The die pads 40 may be between 4-8 µm tall. A conformal dielectric layer 36 may be deposited on the semiconductor portion 34 and the die pads 40. The conformal dielectric layer 36 may be silicon nitride or another suitable material. The conformal dielectric layer 36 may be 1-2 µm tall.

The die 30 may also contain a photosensitive passivation layer 38 deposited on the conformal dielectric layer 36. The photosensitive passivation layer 38 may be a photosensitive dielectric material (such as a JSR ELPAC™ WPR series material available from JSR Corporation) or another suitable material. The photosensitive passivation layer 38, as well as conformal dielectric layer 36, may be selectively removed to form an opening 42 exposing a die pad 40. Opening 42 forms a recessed exposed contact that is present in the die structure prior to installation in a package assembly. Installing the die 30 with one or more exposed recessed contacts provided by opening 42 allows for through via 1 (TV1) to be formed simultaneously with other conductive portions of the packaging assembly. This eliminates the need to deposit additional conductive material when fabricating the die thus eliminating steps in the die fabrication process and saving cost. Additionally, in at least some instances, the ability to simultaneously form TV1 with other features of the package assembly may eliminate the need for an initial BBUL layer prior to the application of the conductive material. This may further reduce complexity and save on fabrication costs.

Figure 5:
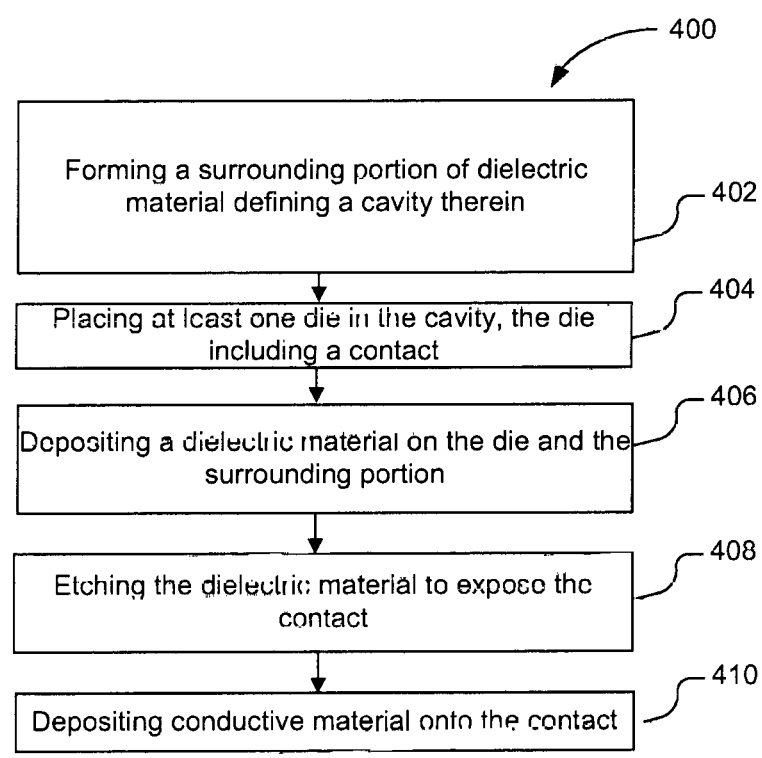
FIG. 5 schematically illustrates a flow diagram of a method of fabricating an IC package assembly, in accordance with some embodiments.

FIG. 5 schematically illustrates a flow diagram of a method 400 of fabricating an IC package assembly (e.g., package assembly 100 of FIG. 3 or package subassembly 80 of FIG. 2(H)), in accordance with some embodiments. The method 400 may comport with techniques described in FIGS. 1(A)-(E), 2(A)-(H), 3, and 4.

At 402, the method 400 may include forming a surrounding portion of dielectric material (e.g., dielectrics region/s 22 in FIG. 1(E)) defining a cavity (e.g., cavity 23 in FIG. 1(E)) therein. In some embodiments, forming the surrounding portion (e.g., dielectrics region/s 22 in FIG. 1(E)) may include forming a conductive path through the surrounding portion (e.g., conductive path 26 in FIG. 1(E)). In some embodiments, forming the conductive path through the surrounding portion (e.g., conductive path 26 in FIG. 1(E)) may include forming a redistribution layer (e.g., redistribution layer 24 in FIG. 1(E)). In some embodiments, forming a surrounding portion of dielectric material (e.g., dielectrics region/s 22 in FIG. 1(E)) may involve lamination or other suitable processing techniques.

At 404, the method 400 may include placing at least one die (e.g., die 30 in FIG. 2(A)) in the cavity, the die including a contact (e.g., die pad 40 in FIGS. 2(A) and 4). In some embodiments, placing the at least one die (e.g., die 30 in FIG. 2(A)) in the cavity may include placing a die having a passivation layer (e.g., passivation layer 38 in FIG. 4) disposed on the contact (e.g. die pad 40 in FIG. 4) and an opening (e.g., opening 42 in FIG. 4) disposed in the passivation layer to expose the contact. In some embodiments, placing the at least one die (e.g., die 30 in FIG. 2(A)) in the cavity may include placing a plurality of dies in the cavity. In some embodiments, placing the at least one die (e.g., die 30 in FIG. 2(A)) in the cavity may include placing a die including a recessed exposed contact (e.g., die pad 40 exposed via opening 42 as seen in FIG. 4). If a plurality of dies is used, in some embodiments, each of the dies may include a recessed exposed contact (e.g., die pad 40 exposed via opening 42 as seen in FIG. 4).

At 406, the method 400 may include depositing a dielectric material (e.g., dielectric material 50 in FIG. 2(C)) on the die (e.g., die 30 in FIG. 2(A)) and the surrounding portion (e.g., dielectrics region/s 22 in FIG. 1(E)). In some embodiments, depositing the dielectric material may form a uniform surface. In some embodiments, depositing the dielectric material may performed by lamination. In some embodiments, depositing the dielectric material may substantially fill portions of the cavity (e.g., cavity 23 in FIG. 1(E)) disposed between the die (e.g., die 30 in FIG. 2(A)) and the surrounding portion of dielectric material (e.g., dielectrics region/s 22 in FIG. 2(A)). In some embodiments, depositing the dielectric material may fill an opening (e.g., opening 42 in FIG. 4) disposed in a passivation layer.

At 408, the method 400 may include etching the dielectric material (e.g., dielectric material 50 in FIG. 2(C)) to expose the contact (e.g., die pad 40 in FIG. 4). In some embodiments, etching the dielectric material may include removing the dielectric material from an opening (e.g., opening 42 in FIG. 4) disposed in a passivation layer. In some embodiments, etching the dielectric material may include exposing at least one additional contact (e.g., contact 52 in FIG. 2(C)) electrically coupled with a conductive path (e.g., conductive path 26 in FIG. 1(E)) through the surrounding portion.

At 410, the method 400 may include depositing conductive material (e.g., conductive material 58 in FIG. 2(F)) onto the contact (e.g., die pad 40 in FIG. 4). In some embodiments, depositing conductive material may involve plating or other suitable techniques.

Various operations are described as multiple discrete operations in turn, in a manner that is most helpful in understanding the claimed subject matter. However, the order of description should not be construed as to imply that these operations are necessarily order dependent.

Figure 6:
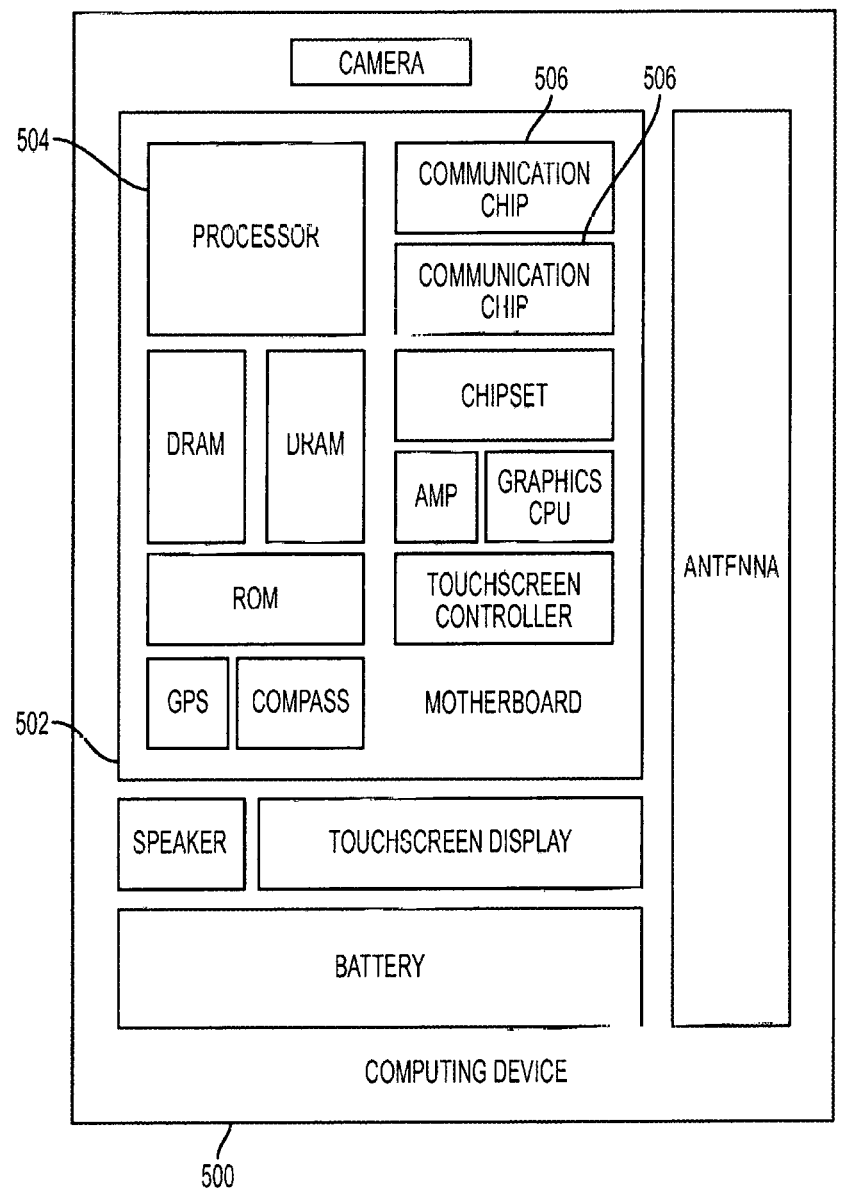
FIG. 6 schematically illustrates a computing device that includes an IC package assembly or package substrates as described herein, in accordance with some embodiments.

Embodiments of the present disclosure may be implemented into a system using any suitable hardware and/or software to configure as desired. FIG. 6 schematically illustrates a computing device 500 that includes an IC package assembly (e.g., package assembly 100 of FIG. 3) or package substrate (e.g., package subassembly 80 of FIG. 2(H)) as described herein, in accordance with some embodiments. The computing device 500 may include housing to house a board such as motherboard 502. Motherboard 502 may include a number of components, including but not limited to processor 504 and at least one communication chip 506. Processor 504 may be physically and electrically coupled to motherboard 502. In some implementations, the at least one communication chip 506 may also be physically and electrically coupled to motherboard 502. In further implementations, communication chip 506 may be part of processor 504.

Depending on its applications, computing device 500 may include other components that may or may not be physically and electrically coupled to motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

Communication chip 506 may enable wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.10 compatible BVVA networks are generally referred to as WiMAX networks, an acronym that stands for Worldwide Interoperability for Microwave Access; which is a certification mark for products that pass conformity and interoperability tests for the IEEE 802.16 standards. Communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. Communication chip 506 may operate in accordance with other wireless protocols in other embodiments.

Computing device 500 may include a plurality of communication chips 506. For instance, a first communication chip 506 may be dedicated to shorter range wireless communications such as Wi-Fi and Bluetooth, and a second communication chip 506 may be dedicated to longer range wireless communications such as GPS, EDGE, GPRS, CDMA, WiMAX, LTE, Ev-DO, and others.

Processor 504 of computing device 500 may be packaged in an IC assembly (e.g., package assembly 100 of FIG. 3) or package substrate (e.g., package subassembly 80 of FIG. 2(H)) as described herein. For example, processor 504 may correspond with one of die 30. The package assembly 100 or subassembly 80 and motherboard 502 may be coupled together using package-level interconnects such as BGA balls 72 or pads 76. The term "processor" may refer to any device or portion of a device that processes electronic data from registers and/or memory to transform that electronic data into other electronic data that may be stored in registers and/or memory.

Communication chip 506 may also include a die (e.g., die 30) that may be packaged in an IC assembly (e.g., package assembly 100 of FIG. 3) or package substrate (e.g., package subassembly 80 of FIG. 2(H)) as described herein. In further implementations, another component (e.g., memory device or other integrated circuit device) housed within computing device 500 may include a die (e.g., die 30) that may be packaged in an IC assembly (e.g., package assembly 100 of FIG. 3) or package substrate (e.g., package subassembly 80 of FIG. 2(H)) as described herein.

In various implementations, computing device 500 may be a laptop, a netbook, a notebook, an Ultrabook™, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

EXAMPLES

According to various embodiments, the present disclosure describes a method of fabricating a package assembly, the method comprising: forming a surrounding portion of dielectric material defining a cavity therein; placing at least one die in the cavity, the die including a contact; depositing a dielectric material on the die and the surrounding portion; etching the dielectric material to expose the contact; and depositing conductive material onto the contact. In some embodiments, forming the surrounding portion includes forming a conductive path through the surrounding portion. In some embodiments, forming the conductive path includes forming a redistribution layer. In some embodiments, forming the surrounding portion is performed by lamination. In some embodiments, depositing the dielectric material is performed by lamination. In some embodiments, depositing the dielectric material substantially fills portions of the cavity disposed between the die and the surrounding portion of dielectric material. In some embodiments, depositing the dielectric material on the die and the surrounding portion forms a uniform surface.

In some embodiments, placing the at least one die includes placing a die having a passivation layer disposed on the contact and an opening disposed in the passivation layer to expose the contact; depositing the dielectric material fills the opening; and etching the dielectric material removes the dielectric material from the opening. In some embodiments, placing the at least one die in the cavity includes placing a plurality of dies in the cavity. In some embodiments, the contact is a recessed exposed contact. In some embodiments, each of the plurality of dies includes a recessed exposed contact. In some embodiments, etching the dielectric material to expose the contact exposes at least one additional contact electrically coupled with a conductive path through the surrounding portion.

According to various embodiments, the present disclosure describes an apparatus (e.g., a package assembly) comprising: a die located in a cavity defined by a surrounding portion of dielectric material, the die having a die contact; a conductive path through the surrounding portion; a dielectric layer disposed on the die and the surrounding portion; and at least one interconnect formed through the dielectric layer and electrically coupled with the die contact, the interconnect being configured to route electrical signals of the die. In some embodiments, the dielectric layer encapsulates the die. In some embodiments, the conductive path through the surrounding portion is configured to electrically couple a first package-level interconnect on a first side of the package assembly to a second package-level interconnect on a second side of the package assembly.

In some embodiments, the package assembling further comprises a second die located in the cavity. In some embodiments, the package assembly is a first package assembly having a first side and a second side disposed opposite to the first side, the first package assembly further comprising: one or more build-up layers disposed on the dielectric layer, wherein the one or more build-up layers are disposed between the die and the first side; and one or more package-level interconnects (e.g., solder balls) disposed on the first side and configured to route the electrical signals of the die between the first package assembly and a circuit board. In some embodiments, the package assembly further comprises package-on-package (PoP) pads disposed on the second side and electrically coupled with the conductive path, the PoP pads being configured to route electrical signals between the circuit board and a second package assembly through the first package assembly.

According to various embodiments, the present disclosure describes a system (e.g., a computing device) comprising: a circuit board; and a package assembly having a first side and a second side disposed opposite to the first side, the first side being coupled with the circuit board using one or more package-level interconnects disposed on the first side, the package assembly including a die located in a cavity defined by a surrounding portion of dielectric material, the die having a die contact; a conductive path through the surrounding portion; a dielectric layer disposed on the die and the surrounding portion; and at least one interconnect formed through the dielectric layer and electrically coupled with the die contact, the interconnect being configured to route electrical signals of the die. In some embodiments, the computing device further comprises a second die located in the cavity. In some embodiments, the conductive path through the surrounding portion is configured to electrically couple a first package-level interconnect on a first side of the package assembly to a second package level interconnect on a second side of the package assembly. In some embodiments, the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method of fabricating a package assembly, the method comprising:
    forming a surrounding portion of dielectric material defining a cavity therein;
    placing at least one die in the cavity, the die including a recessed exposed contact, wherein the contact is recessed in a passivation layer of the die and exposed via an opening in the passivation layer;
    depositing a dielectric material on the die and the surrounding portion;
    etching the dielectric material to expose the contact; and
    depositing conductive material onto the contact.

2. The method of claim 1, wherein:
    depositing the dielectric material is performed by lamination.

3. The method of claim 1, wherein:
    depositing the dielectric material substantially fills portions of the cavity disposed between the die and the surrounding portion of dielectric material.

4. The method of claim 1, wherein:
    depositing the dielectric material on the die and the surrounding portion forms a uniform surface.

5. The method of claim 1, wherein:
    depositing the dielectric material fills the opening in the passivation layer; and
    etching the dielectric material removes the dielectric material from the opening.

6. The method of claim 1, wherein:
    etching the dielectric material to expose the contact exposes at least one additional contact electrically coupled with a conductive path through the surrounding portion.

7. The method of claim 1, wherein:
    forming the surrounding portion is performed by lamination.

8. The method of claim 7, wherein:
    forming the surrounding portion includes forming a conductive path through the surrounding portion.

9. The method of claim 1, wherein:
    placing the at least one die in the cavity includes placing a plurality of dies in the cavity.

10. The method of claim 9, wherein:
each of the plurality of dies includes a recessed exposed contact.

11. The method of claim 1, wherein:
forming the surrounding portion includes forming a conductive path through the surrounding portion.

12. The method of claim 11, wherein:
forming the conductive path includes forming a redistribution layer.

13. The method of claim 11 wherein:
forming the surrounding portion is performed by lamination.

14. The method of claim 11, wherein:
depositing the dielectric material on the die and the surrounding portion forms a uniform surface.

15. A package assembly comprising:
a die located in a cavity defined by a surrounding portion of dielectric material, the die having a die contact;
a conductive path through the surrounding portion;
a dielectric layer disposed on the die and the surrounding portion; and
at least one interconnect formed through the dielectric layer and electrically coupled with the die contact, the interconnect being configured to route electrical signals of the die.

16. The package assembly of claim 15, wherein the dielectric layer encapsulates the die.

17. The package assembly of claim 15, wherein:
the conductive path through the surrounding portion is configured to electrically couple a first package-level interconnect on a first side of the package assembly to a second package-level interconnect on a second side of the package assembly.

18. The package assembly of claim 15, further comprising a second die located in the cavity.

19. The package assembly of claim 15, wherein the package assembly is a first package assembly having a first side and a second side disposed opposite to the first side, the first package assembly further comprising:
one or more build-up layers disposed on the dielectric layer, wherein the one or more build-up layers are disposed between the die and the first side; and
one or more package-level interconnects disposed on the first side and configured to route the electrical signals of the die between the first package assembly and a circuit board.

20. The package assembly of claim 19, further comprising:
package-on-package (PoP) pads disposed on the second side and electrically coupled with the conductive path, the PoP pads being configured to route electrical signals between the circuit board and a second package assembly through the first package assembly.

21. A computing device comprising:
a circuit board; and
a package assembly having a first side and a second side disposed opposite to the first side, the first side being coupled with the circuit board using one or more package-level interconnects disposed on the first side, the package assembly including
a die located in a cavity defined by a surrounding portion of dielectric material, the die having a die contact;
a conductive path through the surrounding portion;
a dielectric layer disposed on the die and the surrounding portion; and
at least one interconnect formed through the dielectric layer and electrically coupled with the die contact, the interconnect being configured to route electrical signals of the die.

22. The computing device of claim 21, further comprising a second die located in the cavity.

23. The computing device of claim 21 wherein:
the conductive path through the surrounding portion is configured to electrically couple a first package-level interconnect on a first side of the package assembly to a second package-level interconnect on a second side of the package assembly.

24. The computing device of claim 21, wherein:
the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

* * * * *